United States Patent [19]

Eimori et al.

[11] Patent Number: 5,097,310
[45] Date of Patent: Mar. 17, 1992

[54] COMPLEMENTARY SEMICONDUCTOR DEVICE HAVING IMPROVED DEVICE ISOLATING REGION

[75] Inventors: Takahisa Eimori; Wataru Wakamiya; Hiroji Ozaki; Yoshinori Tanaka; Shinichi Satoh, all of Hyogo, Japan

[73] Assignee: Mitsubishi Denki Kabushiki Kaisha, Tokyo, Japan

[21] Appl. No.: 409,379

[22] Filed: Sep. 19, 1989

[30] Foreign Application Priority Data

Sep. 29, 1988 [JP] Japan ................. 63-247673

[51] Int. Cl.⁵ ..................... H01L 29/78; H01L 27/08
[52] U.S. Cl. ......................................... 357/42; 357/50
[58] Field of Search ........................ 357/42, 50, 48, 49

[56] References Cited

U.S. PATENT DOCUMENTS

| | | | |
|---|---|---|---|
| 4,519,126 | 5/1985 | Hsu | 357/42 |
| 4,577,391 | 3/1986 | Hsia et al. | 357/42 |
| 4,599,792 | 7/1986 | Cade et al. | 357/53 |
| 4,633,292 | 12/1986 | Fellinger et al. | 357/23.4 |
| 4,646,124 | 2/1987 | Zunino | 357/42 |
| 4,684,971 | 8/1987 | Payne | 357/42 |
| 4,689,653 | 8/1987 | Miyazaki | 357/42 |
| 4,758,984 | 7/1988 | Yoshida | 357/42 |
| 4,771,014 | 9/1988 | Lion et al. | 357/42 |
| 4,829,359 | 5/1989 | O et al. | 357/42 |
| 4,864,379 | 9/1989 | Schade, Jr. | 357/53 |
| 4,876,213 | 10/1989 | Pfiester | 357/42 |
| 4,907,058 | 3/1990 | Sakai | 357/50 |
| 4,942,448 | 7/1990 | Tsukamoto et al. | 357/50 |
| 4,957,874 | 9/1990 | Soejima | 357/42 |

FOREIGN PATENT DOCUMENTS

| | | |
|---|---|---|
| 0010662 | 1/1985 | Japan . |
| 60-160651 | 8/1985 | Japan ................. 357/42 |
| 0186057 | 9/1985 | Japan . |
| 60-223154 | 11/1985 | Japan . |
| 0105862 | 5/1986 | Japan . |
| 2-86163 | 3/1990 | Japan . |

OTHER PUBLICATIONS

"Self-Aligned Quasi-Semiconductor-On-Insulator CMOS", IBM TDB, vol. 31, No. 8, Jan./89, pp. 114-115.

Primary Examiner—Andrew J. James
Assistant Examiner—Viet Q. Nguyen
Attorney, Agent, or Firm—Lowe, Price, LeBlanc & Becker

[57] ABSTRACT

A complementary semiconductor device having an improved capability of isolating devices comprises a P well 3 and an N well 2 both formed adjacent to each other on a main surface of a substrate 1, an N type impurity layer formed in the P well 8 on the main surface of the substrate, a P type impurity layer formed in the N well 9 on the main surface of the substrate, an N type region formed at the junction of the N well and the P well 71 on the main surface of the substrate, a first shield electrode 52 formed between the N type impurity layer 8 and the N type region 71 on the main surface of the substrate through an insulating film and a second shield electrode 51 formed between the N type region 71 and the P type impurity layer 9 on the main surface of the substrate through an insulating film. The first shield electrode 52 is connected to a potential $V_{SS}$ and the second shield electrode 51 and the N type region 71 are connected to a potential $V_{CC}$, so that an N channel MOS transistor 101 comprising the first shield electrode 52 does not turn on and a device comprising the second shield electrode does not form a field effect transistor.

10 Claims, 7 Drawing Sheets

COMPLEMENTARY SEMICONDUCTOR DEVICE HAVING IMPROVED DEVICE ISOLATING REGION

BACKGROUND OF THE INVENTION

1. Field of the Invention

The present invention relates to a complementary semiconductor device and, more particularly, to a complementary semiconductor device in which a field effect transistor isolates a P type semiconductor device region and an N type semiconductor device region.

2. Description of the Background Art

Device isolation between semiconductor devices is performed using a LOCOS (Local Oxidation of Silicon) method, as seen in, for example, Japanese Patent Laying-Open Gazette No. 190869/1987. Isolation between a P type semiconductor device region and an N type semiconductor device region in a complementary semiconductor integrated circuit device has been also performed using the LOCOS method.

Figure 3A:
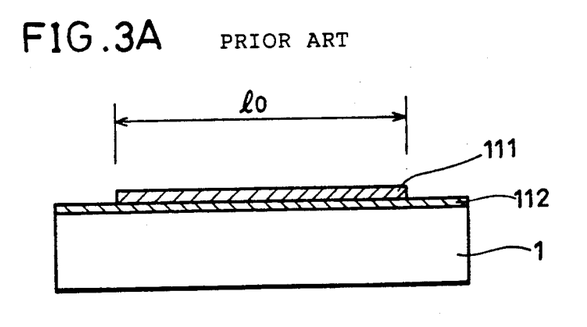
FIGS. 3A to 3C are sectional views of a device at different stages of a manufacturing method of a device isolating film using a conventional LOCOS method.
Figure 3B:
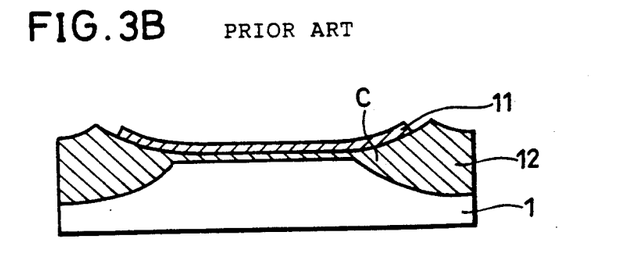
Figure 3C:
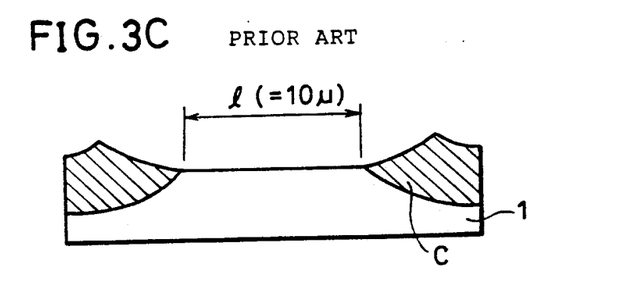

FIGS. 3A to 3C are views showing method for forming on a step by step basis a device isolating film using the LOCOS method. Referring to FIG. 3A, an oxide silicon film 112 is formed on a main surface of a P type silicon substrate 1. Then, a silicon nitride film 111 is formed within the range in which an active region is formed (the range is shown by $l_0$ in FIG. 3A). When the substrate 1 is subjected to thermal oxidation in this state, a thick device isolating film 12 is formed at a region in which the silicon nitride film 111 was not formed as shown in FIG. 3B, because oxidation-proof property of the silicon nitride film is strong. Then, the silicon nitride film 111 and the silicon oxide film 112 are removed from the main surface of the substrate 1. As a result, as shown in FIG. 3C, an active region (shown by 1 in FIG. 3C) is formed.

However, when a device isolating film 12 is formed by a LOCOS method, an encroachment on the active region called bird's beak (the portion shown by C in the figure) is formed at the end portions of the device isolating film. Therefore, actually obtained length l of the active region is considerably smaller than the originally intended length $l_0$ of the active region. As a result, when the device isolation is performed by a LOCOS method, it is difficult to miniaturize the devices. In addition, if the thickness of the device isolating film is thin to control the bird's beak, there the ability to isolate devices is deteriorated.

Figure 3D:
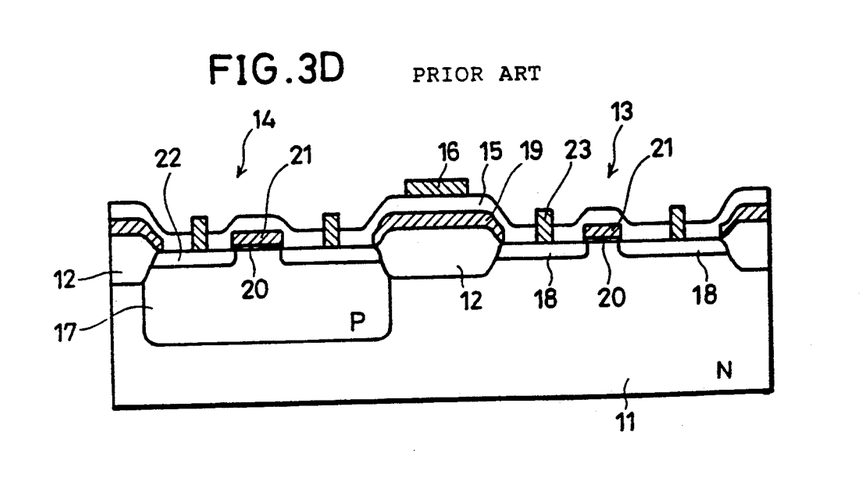
FIG. 3D is a sectional view of a device isolating region formed using both conventional LOCOS method and isolating method using a shield electrode.

In order to cope with the miniaturization of the devices, a method for isolating devices using a field shield isolation is seen in, for example Japanese Patent Laying-Open Gazetted No. 47437/1985. An example in which a well and a substrate are isolated by the field shield method is seen in Japanese Patent Laying-Open Gazette No. 79740/1985. FIG. 3D is a schematic sectional view of a semiconductor device in which a well and a substrate are isolated using the field shield electrode which is seen in the same gazette. Referring to FIG. 3D, a semiconductor device comprising a device isolating region, in which a LOCOS method suitable for the conventional miniaturization is used, comprises an N type silicon substrate 11, a P type well layer 17, a device isolating film 12 formed at the junction with the P type well layer 17 on the N type silicon substrate 11 and a shield electrode 19 formed on the device isolating film 12. A wiring electrode 16 is formed on the shield electrode 19 through an interlayer insulating film 15. An N channel MOSFET 14 is formed on the P type well layer 17 and a P channel MOSFET 13 is formed on the N type silicon substrate 11. The N channel MOSFET 14 comprises an N type source/drain region 22 and a gate electrode 21 formed between the N type source/drain regions 22 through a gate oxide film 20. The P channel MOSFET 13 comprises a P type source/drain region 18 and a gate electrode 21 formed between the P type source/drain regions 18 through a gate oxide film 20. When the device is miniaturized, it is likely that a depletion layer between the P type well layer 17 and the P type source/drain region 18 of the P channel MOSFET 13 formed on the main surface of the N type silicon substrate could be connected. In order to avoid this connection, the shield electrode 19 is formed on the device isolating film 12 and the shield electrode 19 is fixed to, for example, the potential Vcc.

According to this device isolating method, since the shield electrode 19 is formed on a thick field oxide film which was formed by the conventional LOCOS method, it is necessary to align the resist with the field oxide film by photolithography. Since a step portion generated by the field oxide film is big, an upper wiring could be broken. Since the thickness of the device isolating film 12 is thick, a field effect by the shield electrode 19 is not achieved enough. As a result, this device isolating method is not suitable for the miniaturization of a device.

Figure 4:
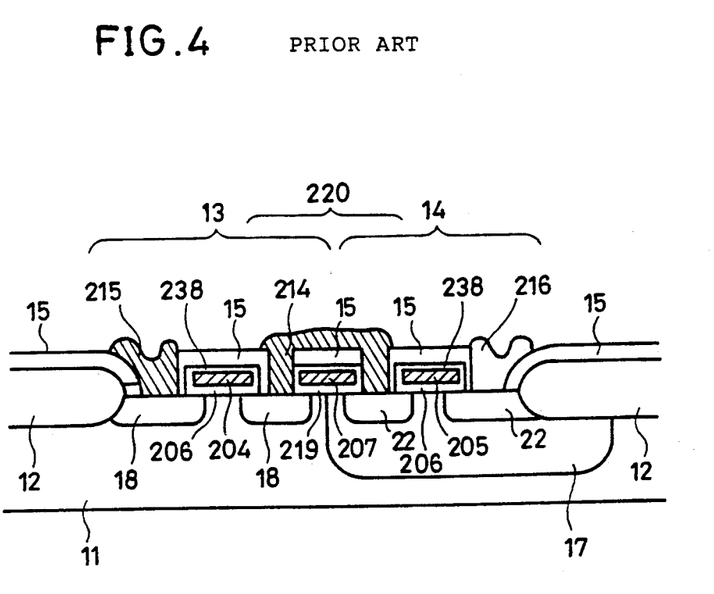
FIG. 4 is a sectional view of a device isolating region formed using a conventional field shield electrode.

In order to solve the above described problems, a method for forming a field shield electrode for isolating wells and its oxide film on the same layer as that of a gate electrode is disclosed in Japanese Patent Laying-Open Gazette No. 169163/1985. FIG. 4 is a sectional view of the semiconductor device shown in the gazette. Referring to FIG. 4, a P channel MOSFET 13 formed on the main surface of an N type silicon substrate 11 and an N channel MOSFET 14 formed on the main surface of a P type well layer 17 are isolated by one field effect transistor 220. The P channel MOSFET 13 comprises a P type source/drain region 18, and a polysilicon gate 204 formed between the P type source/drain regions 18 through a gate oxide film 206. The N channel MOSFET 14 comprises an N type source/drain region 22 and a polysilicon gate 205 between the N type source/drain regions 22 through a gate oxide film 206. The field effect transistor 220 for isolation comprises either one region 18 of the P type source/drain regions formed on the main surface of the N type silicon substrate 11, either one region 22 of the N type source/drain regions formed on the main surface of the P type well layer 17 and a polysilicon layer 207 formed at the junction between the N type silicon substrate 11 and the P type well layer 17 on the main surface of the N type silicon substrate 11 through the gate oxide film 219. A polysilicon gate 204 serving as a gate electrode of the P channel MOSFET 13, a polysilicon gate 205 serving as a gate electrode of the N channel MOSFET and a polysilicon layer 207 serving as a gate electrode of the field effect transistor 220 for isolating devices are formed on the same polysilicon layer. Either one region 22 of the N type source/drain region of the N channel MOSFET 14 and either one region 18 of the P type source/drain regions of the P channel MOSFET 13 are connected by a metal wiring 214. However, the well isolation in this structure is not perfect. The reason is described hereinafter.

Figure 5A:
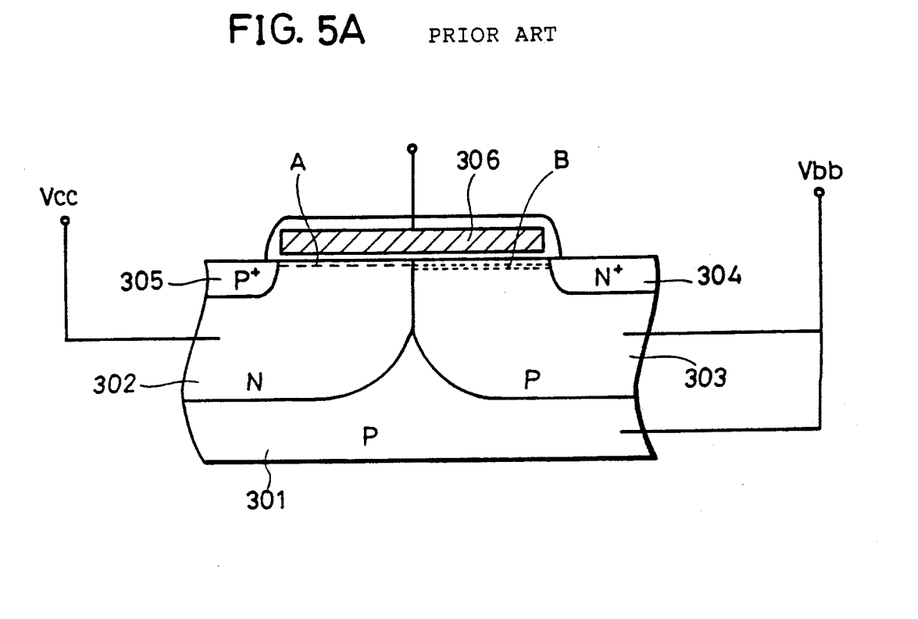
FIG. 5A is a sectional view of a device isolating region when the conventional field shield electrode is applied to well isolation in a twin well structure.

FIG. 5A is a schematic view in case where the well isolation in a twin well structure on a P type substrate often used in a DRAM is performed using a field shield electrode. Normally, an N type well layer 302 is fixed to the supply voltage $V_{CC}$ (positive potential). A P type well layer 303 and a P type substrate 301 are fixed to a substrate potential $V_{BB}$ (negative potential). If the field shield electrode 306 is fixed at the supply voltage $V_{CC}$, a storage layer is formed on a substrate surface portion A on the N type well layer 302 beneath the field shield electrode 306 and an inversion layer is formed on the substrate surface portion B on the P type well layer 303. In this case, there is no problem at the substrate surface portion A, but the following problem arises when an N type diffusion layer 304 is brought to the ground potential $V_{SS}$ at the substrate surface portion B. That is, when the transistor having the N type well layer 302 as its drain, the N type diffusion layer 304 as its source and the field shield electrode 306 as its gate turns on, then a leak path is formed between the N type diffusion layer 304 and the N type well layer 302. The similar leak path is formed at the substrate surface portion A on the same principle when the field shield electrode 306 is brought to the substrate potential $V_{BB}$.

Figure 5B:
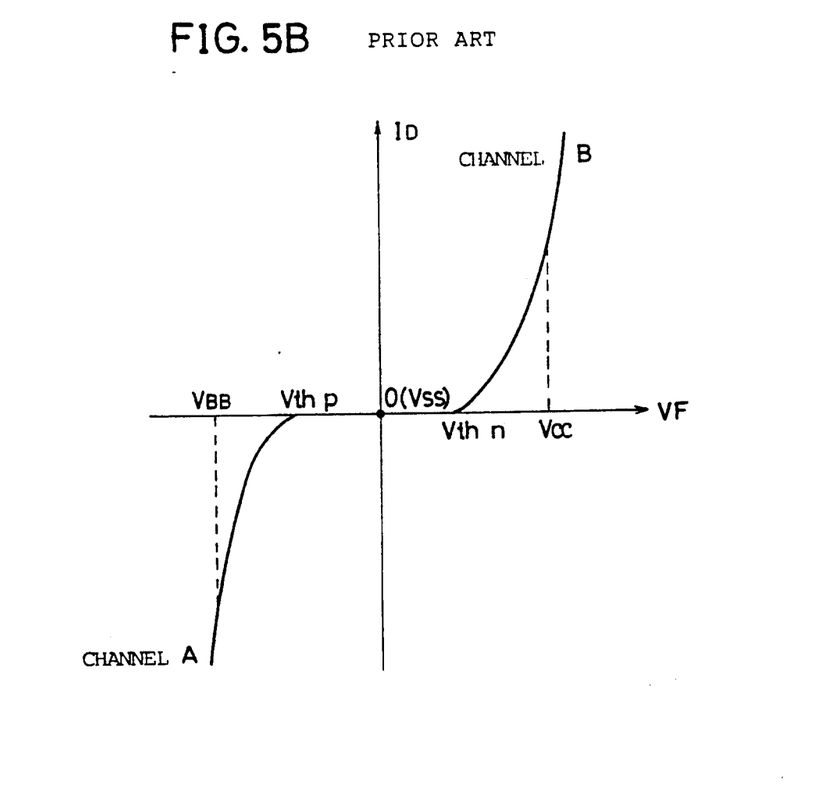
FIG. 5B is a view showing the relation between a potential of the field shield electrode and a leak current.

FIG. 5B is a graph schematically showing the relation between a potential $V_F$ of the field shield electrode 306 and a leak current $I_D$. An abscissa shows a potential of the field shield electrode 306 and ordinate shows a leak current value when the substrate surface A or the substrate surface B serves as a channel. When the field shield electrode 306 is fixed to the ground potential $V_{SS}$, the leak current does not flow on the substrate surface A or the substrate surface B. However, the potential of the field shield electrode actually fluctuates due to capacity coupling between diffusion portions formed on opposite sides, an upper wiring and the like. When the fluctuated potential exceeds a threshold voltage $V_{thP}$ or $V_{thN}$ of the field effect transistor formed on the substrate surface A or the substrate surface B, the leak current flows again. In order to prevent the leak current from generating, both absolute values of the threshold voltage $V_{thP}$ on the side of the P channel and the threshold voltage $V_{thN}$ on the side of the N channel have to be set high. As a result, it becomes difficult to set a process parameter for determining a threshold voltage and also it becomes difficult to determine the length of the field shield electrode 306 at the time of setting and the width of the device isolating region comprising the field shield electrode and the diffusion layer. The above mentioned problem always arises when the well isolation is performed by one shield electrode. According to this method, since the gate electrode for the field shield for isolation and the gate electrodes of the P channel MOSFET and the N channel MOSFET are formed on the same layer, a design thereof is considerably limited.

Figure 6:
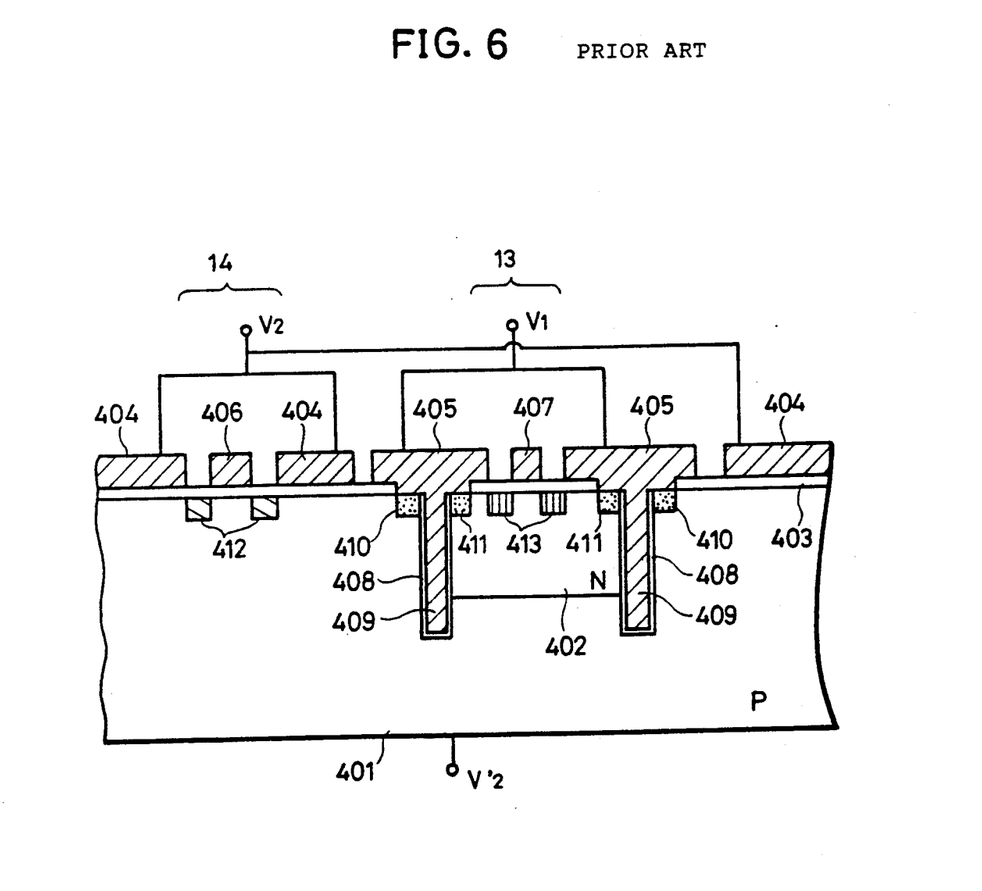
FIG. 6 is a sectional view of a device isolating region formed using a conventional field shield isolation and trench isolation together.

FIG. 6 is a schematic sectional view showing the well isolation using both field shield isolation and trench isolation seen in Japanese Patent Laying-Open Gazette No. 290753/1986. Referring to FIG. 6, an N channel MOSFET 14 formed on a main surface of a P type silicon substrate 401 and a P channel MOSFET 13 formed on a main surface of an N type well layer 402 are isolated by field shield electrodes 404 and 405 and a trench 409. The field shield electrode 405 is held at a first potential $V_1$ and the field shield electrode 404 is held at a second potential $V_2$. Since the well isolating method shown in FIG. 6 uses both the field shield isolation and the trench isolation, the capability of isolating devices is high, but it is necessary to form a trench, with the result that a manufacturing process becomes complicated. In addition, there is a problem that the area of the region in which the trench is formed is reduced from the area of the active region.

SUMMARY OF THE INVENTION

An object of the present invention is to improve the capability of isolating devices in a complementary semiconductor memory device.

Another object of the present invention is to improve the capability of isolating devices by effectively using a field effect in a complementary semiconductor device.

A further object of the present invention is to raise the capability of isolating devices without decreasing a high degree of integration in a complementary semiconductor device.

The above described object of the present invention can be attained when a complementary semiconductor device employs the following structural features. That is, a complementary semiconductor device in accordance with the present invention comprising a first region of a first conductivity type formed on a main surface of a substrate and a first region of a second conductivity type different from the first conductivity type, formed adjacent to the first region of the first conductivity type comprises a second region of a second conductivity formed in the first region of the first conductivity type; a second region of the first conductivity type formed on the first region of the second conductivity type; first conduction controlling means formed on the first region of the first conductivity type and using a field effect for preventing conduction between the first region of the second conductivity type and the second region of the second conductivity type; and second conduction controlling means using a field effect for preventing the conduction between the first region of the first conductivity type and the second region of the first conductivity type.

Since the complementary semiconductor device comprises the above described structural features, conduction does not occur between the first region of the first conductivity type and the second region of the first conductivity type, and between the first region of the second conductivity type and the second region of the second conductivity type. As a result, there can be provided a complementary semiconductor device having the improved capability of isolating devices.

In accordance with another aspect of the present invention, the complementary semiconductor device comprises a third region of the second conductivity type formed at the contact portion between the first region of the first conductivity type and the first region of the second conductivity type on the main surface of the substrate.

The first conduction controlling means comprises the second region with the second conductivity type, the third region of the second conductivity type and a first conductive layer formed at the region between the second region of the second conductivity type and the third region of the second conductivity type on the main surface of the substrate through an insulating film, and the first conduction controlling means comprises a field effect device.

Since the complementary semiconductor device comprises the above mentioned structural features, the device isolation is performed using the field effect device. As a result, there is provided a complementary semiconductor device in which the capability of isolating devices is improved by effectively using the field effect.

In accordance with another aspect of the present invention, the field effect device comprises a field effect transistor; the second conduction controlling means comprises the third region of the second conductivity type, the second region of the fist conductivity type and a second conductive layer formed at the region between the third region of the second conductivity type and the second region of the first conductivity type on the main surface of the substrate through an insulating film; and the first conductive layer is connected to a first potential and the third region of the second conductivity type and the second conductive layer are connected to a second potential.

Since the complementary semiconductor device comprises the above described structural features, the region between the first region of the first conductivity type and the second region of the first conductivity type is turned off by the field effect transistor and the field effect transistor is not formed between the first region of the second conductivity type and the second region of the second conductivity type. The device isolation is performed using the field effect transistor and the device having the same configuration as that of the transistor. As a result, there is provided a complementary semiconductor device in which the capability of isolating devices can be improved without deteriorating a high degree of integration.

In accordance with still another aspect of the present invention, the complementary semiconductor device comprises third conduction controlling means formed at the contact portion between the first region of the first conductivity type and the second region of the second conductivity type on the substrate.

Since the complementary semiconductor device comprises the above described structural features, the device isolation is performed by three conduction controlling means. As a result, there is provided as complementary semiconductor device having improved capability of isolating devices.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1A:
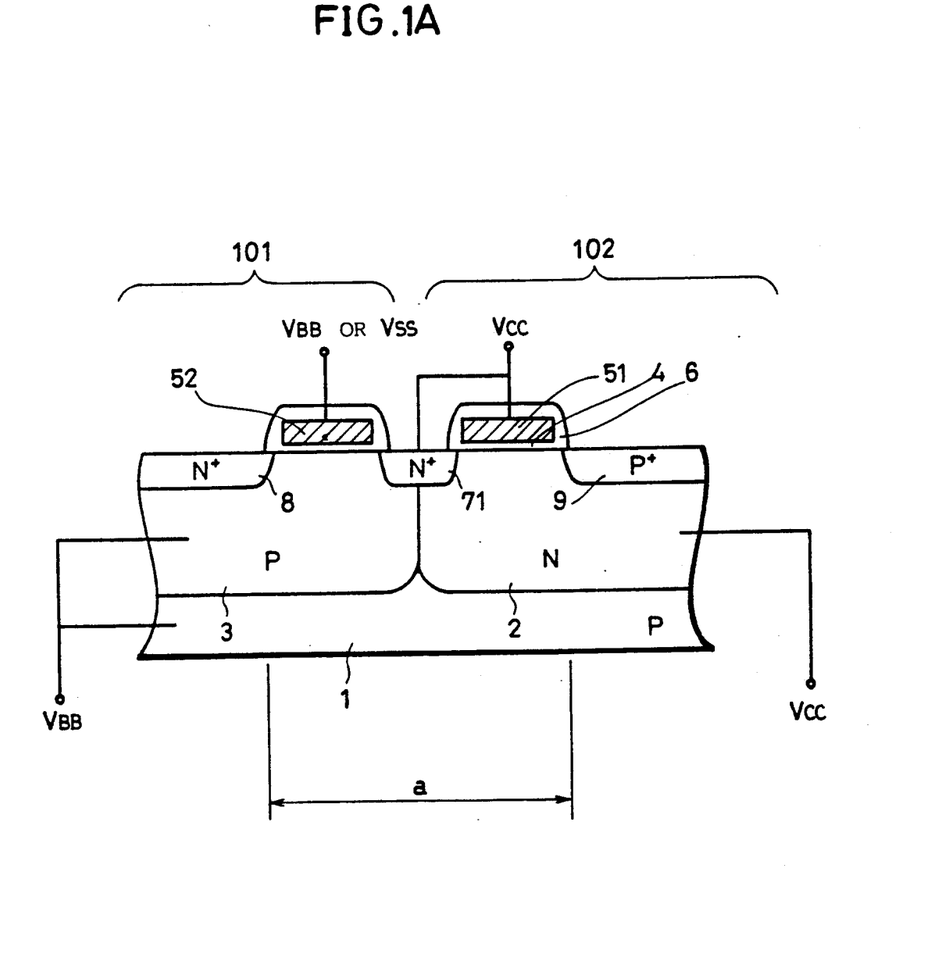
FIG. 1A is a sectional view of a complementary semiconductor device in accordance with a first embodiment of the present invention.

Referring to FIG. 1, a description is made of embodiments of the present invention. FIG. 1A is a sectional view of a complementary semiconductor device in accordance with a first embodiment of the present invention. Referring to FIG. 1A, the complementary semiconductor device in accordance with the present invention comprises a device 101 on a P type well formed on a main surface of a P type well layer 3 and a device 102 on an N type well formed on a main surface of the N type well layer 2. The P type well layer 3 and the N type well layer 2 are formed adjacent to each other on the main surface of the P type silicon substrate. The device 101 on the P type well comprises an N type diffusion region 8 formed on the main surface of the P type well layer 3, an N type diffusion region 71 formed on the main surface of the junction of the P type well layer 3 and the N type well layer 2 and a shield electrode 52 formed between the N type diffusion region 71 and the N type diffusion region 8 on the main surface through a gate oxide film 4. The shield electrode 52 is held at a bias potential $V_{BB}$ or the ground potential $V_{SS}$.

The device 102 on the N type well comprises a P type diffusion region 9 formed on the main surface of the N type well layer 2, an N type diffusion region 71 (which is also used in the device on the P type well) formed on the main surface of the junction of the P type well layer 3 and the N type well layer 2 and a shield electrode 51 formed between the P type diffusion region 9 and the N type diffusion region 71 on the main surface through a gate oxide film 4. The shield electrode 51 and the N type diffusion region 71 are held at the supply voltage $V_{CC}$.

Since the shield electrode 52 on the P type well layer 3 is held at the potential $V_{BB}$ or $V_{SS}$, a storage layer is formed beneath the shield electrode 52. Therefore, a field effect transistor (the device on the P type well) 101 having the N type diffusion regions 8 and 71 as its source/drain is always in an off state. Although P type diffusion region 9 and the N type diffusion region 71 which are impurity layers of different types exist at opposite sides of the shield electrode 51 on the N type well layer, a field effect transistor is not formed because their types of the diffusion layers are different. Therefore, the leak path is not generated. A threshold voltage of the shield electrode 52 can be originally determined. Therefore, if the ground potential $V_{SS}$ which does not form the storage layer is selected, the leak path is not generated.

In addition, the dimension between the device isolating region (the portion shown by "a" in the figure) can be within 5 μm. An impurity concentration of the P type well layer is approximately $10^{16}$–$10^{17}$/cm$^3$ and an impurity concentration in the N type well layer 2 is also approximately $10^{16}$–$10^{17}$/cm$^3$.

Figure 1B:
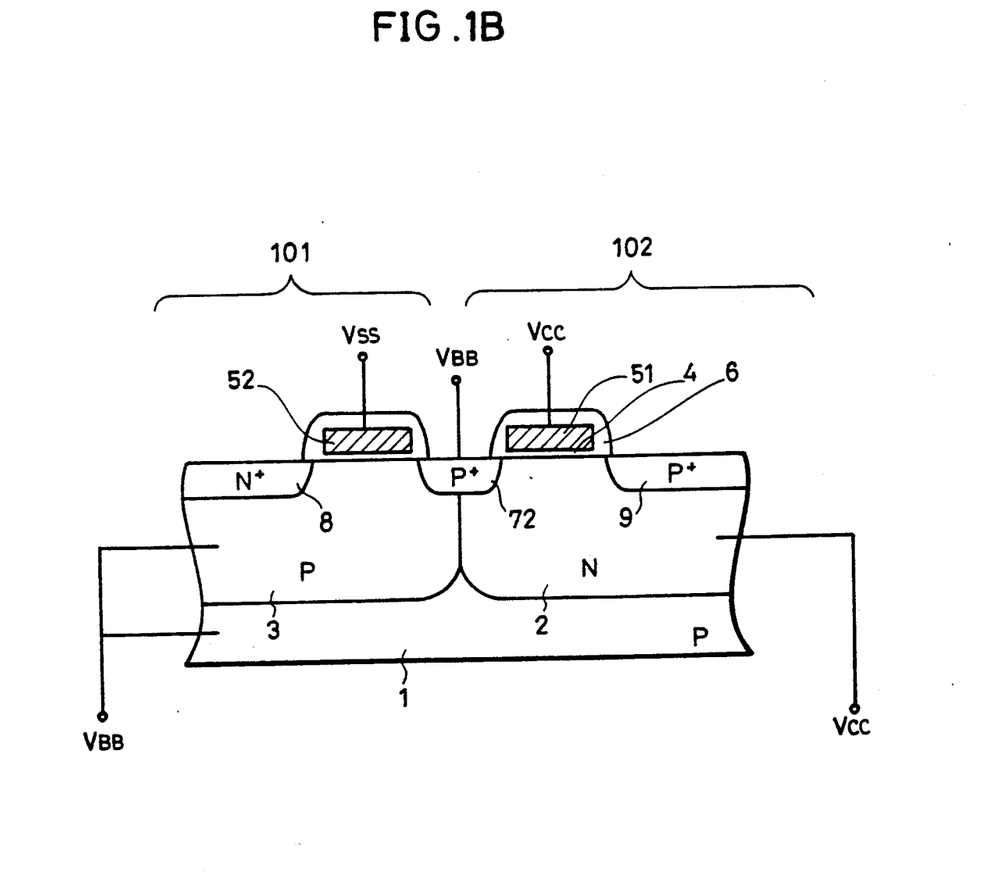
FIG. 1B is a sectional view of a complementary semiconductor device in accordance with a second embodiment of the present invention.

FIG. 1B is a sectional view of a complementary semiconductor device in accordance with a second embodiment of the present invention. Referring to FIG. 1B, the device is different from that of FIG. 1A in that a diffusion region formed at the junction of a P type well layer 3 and an N type well layer 2 on the main surface is P type. Since other portion are the same as those in FIG. 1A, the same reference characters are added to those corresponding portions and a description thereof is omitted. Since a storage layer is formed beneath a shield electrode 51 on the N type well layer, a field effect transistor (a device on the N type well) having P type diffusion regions 9 and 72 as its source/drain is always an off state. Since impurity layers having different types of the diffusion layers are formed on opposite sides of the shield electrode 52 formed in the one P type well layer 3, the device 101 on the P type well does not form a field effect transistor, whereby a leak path is not formed. In this case, an impurity concentration and the width of the device isolating region are also the same as those in FIG. 1A.

Figure 2:
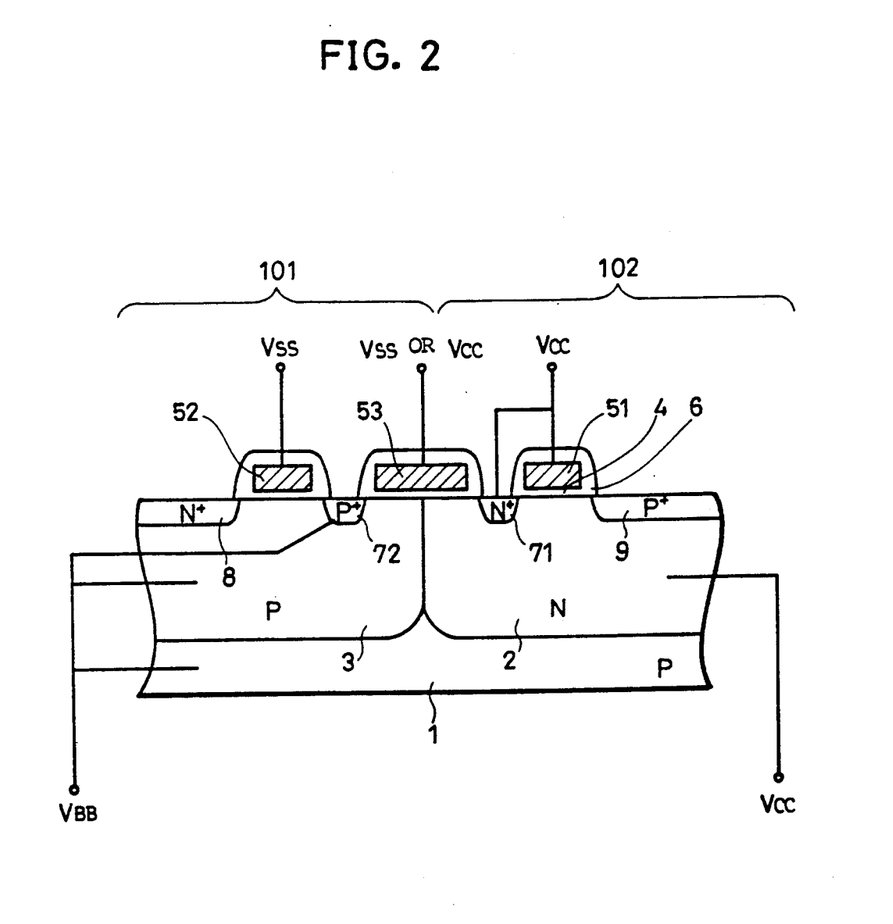
FIG. 2 is a sectional view of a complementary semiconductor device in accordance with a third embodiment of the present invention.

FIG. 2 is a sectional view of a complementary semiconductor device in accordance with a third embodiment of the present invention. Referring to FIG. 2, the complementary semiconductor device in accordance with the third embodiment of the present invention comprises a device 101 on a P type well formed on a main surface of a P type well layer 3, a device 102 on an N type well formed on a main surface of an N type well layer and a shield electrode 53 formed at the junction of the P type well layer 3 and the N type well layer 2 on the main surface. The device 101 on the P type well comprises an N type diffusion region 8 and a P type diffusion region 72 formed on a main surface of the P type well layer 3 and a field electrode 52 formed on the surface between the N type diffusion region 8 and the P type diffusion region 72 through an insulating film. The device 102 on the N type well comprises a P type region diffusion region 9 and an N type diffusion region 71 formed on the main surface of the Ñ type well layer 2 and a shield electrode 51 formed on the surface between the P type diffusion region 9a and the N type diffusion region 71 through a gate oxide film 4. The shield electrode 52 is fixed at the ground potential $V_{SS}$, the shield electrode 53 is fixed at the ground potential $V_{SS}$ or the supply voltage $V_{CC}$ and the shield electrode 51 and the N type diffusion region 71 are fixed at the supply voltage $V_{CC}$. The P type silicon substrate 1, the P type well layer 3 and the P type diffusion region 72 are fixed at a substrate bias voltage $V_{BB}$. The N type well layer 2 is fixed at the supply voltage $V_{CC}$.

· Since both shield electrodes 51 and 52 have different types of diffusion layers on their opposite side in the complementary semiconductor device having a structure shown in FIG. 2, the leak path formed by a field effect transistor is not formed. Furthermore, there are diffusion layers 71 and 72 of different types formed between the P type well layer 3 and the P type diffusion region 9 and between the N type well layer 2 and the N type diffusion region 8, respectively, so that the leak path is not formed. Therefore, the device isolation between the P type well layer 3 and the N type well layer 2 can be carried out reliably.

In FIG. 2, the N type diffusion region 71 is fixed at the supply voltage $V_{CC}$ and P type diffusion region 72 in the P type well layer 3 is fixed at the substrate potential $V_{BB}$. As a result, there is an effect that operation of the complementary semiconductor device is stabilized. The shield electrodes 51, 52 and 53 are patterned and formed in the same processing. Therefore, the N type diffusion region 71 and the P type diffusion region 72 are formed using the shield electrodes 51, 52 and 53 as masks by a self-alignment method. It is not necessary to form a mask for formation of the N type diffusion region and also it is not necessary to form another mask for formation of the P type diffusion region as conventional. As a result, it is possible to provide a complementary semiconductor device in which the device isolation thereof can be perfectly performed and a manufacturing method thereof is easy.

In the above embodiment, the distance between the field shield electrode and the diffusion layers formed on opposite sides thereof was not particularly defined. A transistor for isolating the field shields may be formed of the so-called offset type field effect transistor in which the field shield electrode is spaced apart from the impurity diffusion regions formed on opposite sides thereof. In this case, the threshold of the field effect transistor becomes high and it is possible to implement device isolation and well isolation which put up strong resistance to a noise and have an excellent capability of isolation.

According to the present invention, there is provided a complementary semiconductor device comprising a P type region and an N type region adjacent thereto in which conduction controlling means is provided at each region using a field effect so that the P type region and the P type diffusion layer in the N type region may not be rendered conductive and the N type region and the N type diffusion layer in the P type region may not be rendered conductive. Accordingly, it is possible to isolate devices at the contact portion in the complementary semiconductor device using the shield electrode which is capable of being miniaturized. As a result, it is possible to provide a complementary semiconductor device in which well isolation is reliably performed in a miniaturized LSI and the width of the device isolating region can be easily determined.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A complementary semiconductor device comprising a first region of a first conductivity type formed on a main surface of a substrate of said first conductivity type and a second region of a second conductivity type different from said first conductivity type formed adjacent to, and electrically isolated from, said first region, said complementary semiconductor device comprising:
a third region of the second conductivity type formed in said first region;
a fourth region of the first conductivity type formed in said second region;
first conduction controlling means formed on said first region for preventing conduction between said second region and said third region; and
second conduction controlling means formed on said second region for preventing conduction between said first region and said fourth region;
a fifth region of conductivity formed at the junction between said first region and said second region on the main surface of said substrate, wherein
said first conduction controlling means comprises a field effect transistor comprising said third region, said fifth region and a first conductive layer formed at the region between said third region and said fifth region on the main surface of said substrate through an insulating film, said first conductive layer is connected to a first potential; and said second conduction controlling means comprises said fifth region, said fourth region and a second conductive layer formed at the region between said fifth region and said fourth region on the main surface of said substrate through an insulating film, said fifth region and said second conductive layer are connected to a second potential different from said first potential.

2. A complementary semiconductor device in accordance with claim 1, wherein said first conductive layer and said second conductive layer comprise polysilicon.

3. A complementary semiconductor device comprising a first region of a first conductivity type formed on a main surface of a substrate of said first conductivity type and a second region of a second conductivity type different from said first conductivity type formed adjacent to, and electrically isolated from, said first region, said complementary semiconductor device comprising:
- a third region of the second conductivity type formed in said first region;
- a fourth region of the first conductivity type formed in said second region;
- first conduction controlling means formed on said first region for preventing conduction between said second region and said third region; and
- second conduction controlling means formed on said second region for preventing conduction between said first region and said further region;
- third conduction controlling means formed at the region between said first region of the first conductivity type and said second region of second conductivity type on the main surface of said substrate;
- a fifth region of the first conductivity type formed between said third region and said second region on the main surface of said substrate; and
- a sixth region of the second conductivity type formed between said first region and said fourth region on the main surface of said substrate.

4. A complementary semiconductor device in accordance with claim 3, wherein said first conduction controlling means comprises said third region, said fifth region and a first conductive layer formed at the region between said third region and said fifth region on the main surface of said substrate through an insulating film, said second conduction controlling means comprises said sixth region, said fourth region and a second conductive layer formed at the region between said sixth region and said fourth region on the main surface of said substrate through an insulating film, and said third conduction controlling means comprises said fifth region, said sixth region and a fifth conductive layer formed at the region between said fifth region and said sixth region on the main surface of said substrate through an insulating film, an intervening insulating material separating said fifth conductive layer from said substrate.

5. A complementary semiconductor device in accordance with claim 4, wherein said first, second and third conduction controlling means each comprise a field effect device.

6. A complementary semiconductor device in accordance with claim 5, wherein said first, second and third conduction controlling means each comprise a field effect device.

7. A complementary semiconductor device in accordance with claim 6, wherein said first conductive layer is connected to a first potential, said second conductive layer is connected to a second potential different from said first potential, said fifth conductive layer is connected to the first potential and said sixth region is connected to the second potential.

8. A complementary semiconductor device in accordance with claim 6, wherein said first conductive layer is connected to a first potential, said second conductive layer is connected to a second potential different from said first potential, said fifth conductive layer is connected to the second potential and said sixth region is connected to the second potential.

9. A complementary semiconductor device comprising a first region of a first conductivity type formed on a main surface of a substrate of said first conductivity type and a second region of a second conductivity type different from said first conductivity type formed adjacent to, and electrically isolated from, said first region, said complementary semiconductor device comprising:
- a third region of the second conductivity type formed in said first region;
- a fourth region of the first conductivity type formed in said second region;
- first conduction controlling means formed on said first region for preventing conduction between said second region and said third region; and
- second conduction controlling means formed on said second region for preventing conduction between said first region and said fourth region;
- a fifth region of the first conductivity type formed at the junction between said first region and said second region on the main surface of said substrate; wherein said second conduction controlling means comprises a field effect transistor comprising the fifth region, said fourth region and a first conductive layer formed at the region between said fifth region and said fourth region on the main surface of said substrate through an insulating film, said second conductive layer is connected to a first potential;

said first conduction controlling means comprises said fifth region, said third region and a second conductive layer formed at the region between said fifth region and said third region on the main surface of said substrate through an insulating film, said first conductive layer is connected to a second potential different from said first potential, and said fifth region is connected to a third potential different from said first and second potentials.

10. A complementary semiconductor device in accordance with claim 9, wherein said first conductive layer and said second conductive layer comprise polysilicon.

* * * * *